US 8,468,187 B2

(12) United States Patent
Yokokawa et al.

(10) Patent No.: US 8,468,187 B2
(45) Date of Patent: Jun. 18, 2013

(54) DIGITAL FILTER DEVICE, PHASE DETECTION DEVICE, POSITION DETECTION DEVICE, AD CONVERSION DEVICE, ZERO CROSS DETECTION DEVICE, AND DIGITAL FILTER PROGRAM

(75) Inventors: Narutoshi Yokokawa, Mishima (JP); Shouichi Sato, Izunokuni (JP)

(73) Assignee: Toshiba Kikai Kabushiki Kaisha, Tokyo (JP)

( * ) Notice: Subject to any disclaimer, the term of this patent is extended or adjusted under 35 U.S.C. 154(b) by 1210 days.

(21) Appl. No.: 12/306,587

(22) PCT Filed: Jun. 14, 2007

(86) PCT No.: PCT/JP2007/062011
§ 371 (c)(1),
(2), (4) Date: Dec. 24, 2008

(87) PCT Pub. No.: WO2008/004422
PCT Pub. Date: Jan. 10, 2008

(65) Prior Publication Data
US 2009/0313313 A1      Dec. 17, 2009

(30) Foreign Application Priority Data
Jul. 3, 2006    (JP) .................................. 2006-183817

(51) Int. Cl.
*G06F 17/10*      (2006.01)
*G06F 15/00*      (2006.01)
(52) U.S. Cl.
USPC .......................................... 708/300; 708/200

(58) Field of Classification Search
USPC .................................................... 708/300, 200
See application file for complete search history.

(56) References Cited

U.S. PATENT DOCUMENTS

| | | | |
|---|---|---|---|
| 4,926,072 A | | 5/1990 | Hyodo |
| 5,043,653 A | * | 8/1991 | Foster et al. ..................... 322/32 |
| 5,739,659 A | * | 4/1998 | Ezuka ............................ 318/605 |
| 6,670,831 B2 | * | 12/2003 | Mashimo ......................... 327/34 |

FOREIGN PATENT DOCUMENTS

| | | | |
|---|---|---|---|
| JP | 51-028465 | | 3/1976 |
| JP | 61237013 A | * | 10/1986 |
| JP | 63-47083 | | 12/1988 |
| JP | 64-077312 | | 3/1989 |

(Continued)

OTHER PUBLICATIONS

Japanese Office Action dated Jul. 19, 2011 issued in JP 2006-183817.

(Continued)

*Primary Examiner* — Chuong D Ngo
(74) *Attorney, Agent, or Firm* — DLA Piper LLP (US)

(57) ABSTRACT

A digital filter device capable of removing the effect of noise such as chattering from a zero crossing signal is provided. A digital filter device 4 filtering a binary digital signal DIN and outputting a binary digital signal DOUT is provided with a toggle flip-flop 12 which switches a signal level of the digital signal DOUT each time a trigger signal is input; an XOR circuit 13 which outputs a first enable signal EN1 while a signal level of the digital signal DIN does not match with the signal level of the output digital signal DOUT; and a charge counter 14 which counts in synchronization with a clock signal CLK while the first enable signal EN1 is input and resets the count to an initial value and outputs a carry on signal ON_RCO as the trigger signal to the toggle flip-flop 12 when the count has reached an upper limit value.

7 Claims, 8 Drawing Sheets

FOREIGN PATENT DOCUMENTS

| JP | 04-274613 | 9/1992 |
|---|---|---|
| JP | 4-347923 | 12/1992 |
| JP | 11-050941 | 2/1999 |
| JP | 2004-012168 | 1/2004 |
| JP | 2004-239085 | 8/2004 |
| JP | 2005-002926 | 1/2005 |

OTHER PUBLICATIONS

English Language Translation of Japanese Office Action dated Jul. 19, 2011 issued in JP 2006-183817.
English Language Abstract of JP 4-347923 published Dec. 3, 1992.
Search Report of PCT/JP2007/062011, Sep. 11, 2007.
English language translation of JP-2004-012168, Jan. 15, 2004.
English language translation of JP-2004-239085, Aug. 26, 2004.
English language translation of JP-2005-002926, Jan. 6, 2005.
English language translation of JP-11-050941, Feb. 3, 1999.
English Abstract of JP-64-077312, Mar. 23, 1989.
English Abstract of JP-04-274613, Jan. 6, 2005.

\* cited by examiner

DIGITAL FILTER DEVICE, PHASE DETECTION DEVICE, POSITION DETECTION DEVICE, AD CONVERSION DEVICE, ZERO CROSS DETECTION DEVICE, AND DIGITAL FILTER PROGRAM

TECHNICAL FIELD

The present invention relates to a digital filter device, a phase detection device, a position detection device, an AD conversion device, a zero cross detection device, and a digital filter program.

BACKGROUND ART

Binary digital signals obtained by converting analog signals output from a resolver to a digital format (RD conversion, comparate) and other digital signals representing a waveform by fluctuation of the signal level (potential etc.) contain noise due to various factors mixed in them.

Figure 7A:
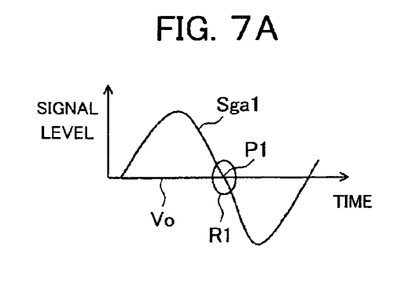
FIGS. 7A-7E are diagrams explaining the problem of the prior art.
Figure 7B:
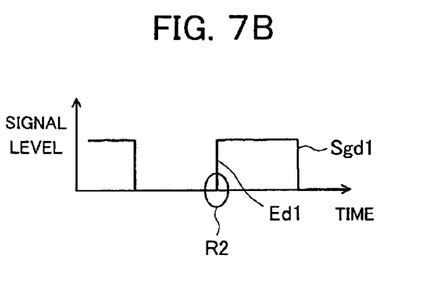

FIG. 7A to FIG. 7E are diagrams explaining the effects of chattering upon a zero cross of an analog signal and a digital signal. FIG. 7A is a diagram showing 1 cycle's worth of an analog signal Sga1. The abscissa indicates the time (phase), while the ordinate indicates the signal level. Further, FIG. 7B is a diagram showing a digital signal Sgd1 obtained by converting the analog signal Sga1 of FIG. 7A to a digital format. The abscissa indicates the time (phase), while the ordinate indicates the signal level.

As shown in FIG. 7A, the analog signal Sga1 is identified in its period and phase based on a zero cross point P1 crossing a signal level forming the standard (crossing zero), that is, the reference level Vo. Further, as shown in FIG. 7B, the position of the zero cross point of the analog signal Sga1 corresponds to the position of a rising edge Ed1 (or trailing edge) of the digital signal Sgd1.

Figure 7C:
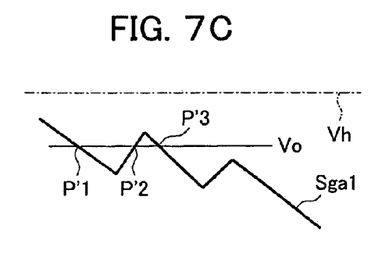
Figure 7D:
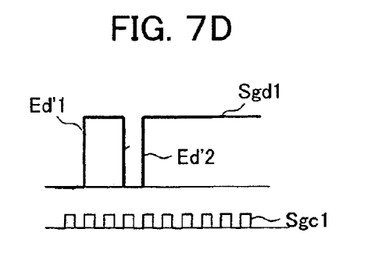

FIG. 7C is an enlarged diagram of a region R1 of FIG. 7A, that is, an enlarged diagram near the zero cross point P1, while FIG. 7D is an enlarged diagram of a region R2 of FIG. 7B, that is, an enlarged diagram near the rising edge Ed1. Note that, in FIG. 7D, a clock signal Sgc1 is shown as well.

When viewing this macroscopically as in FIG. 7A and FIG. 7B, the analog signal Sga1 crosses zero at one point, while the digital signal Sgd1 has one rising edge Ed1. However, when viewing this microscopically as in FIG. 7C, due to chattering, the analog signal Sga1 crosses zero at a plurality of points (zero cross points P'1 to P'3). Further, as shown in FIG. 7D, if the period of the chattering is the period of the clock signal Sgc or more, the digital signal Sgd1 has a plurality of rising edges Ed'1 and Ed'2.

Figure 7E:
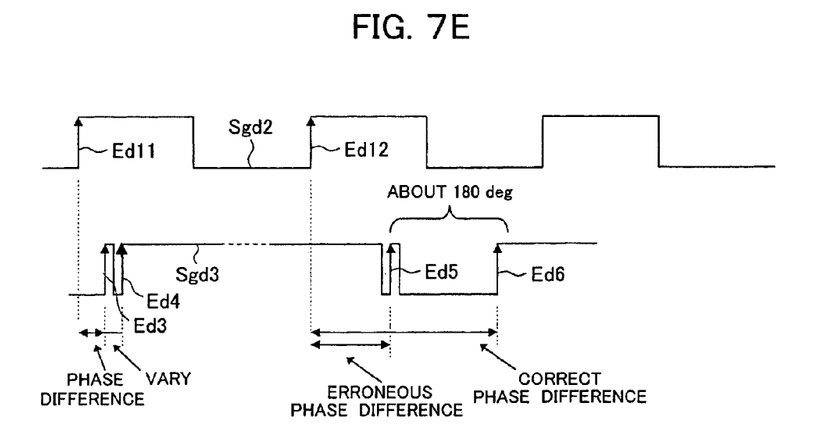

FIG. 7E is a diagram explaining the effect of the chattering upon phase measurement and shows a binary digital signal Sgd3 obtained by converting a plurality of cycles' worth of the analog signal Sga1 to a digital format and a reference signal Sgd2 compared with the digital signal Sgd3. The abscissa indicates the time (phase), while the ordinate indicates the signal level.

As shown at the left side of FIG. 7E on the page, when one rising edge should be generated in the digital signal Sgd3 corresponding to a rising edge Ed11 of the reference signal Sgd2, yet a plurality of rising edges Ed3 and Ed4 are generated due to chattering, the phase difference of the digital signal Sgd3 of the reference signal Sgd2 from the edge Ed11 will fluctuate (suffer from error) by exactly the phase difference between the rising edges Ed3 and Ed4.

Further, as shown at the right side of FIG. 7E on the page, if a rising edge Ed6 is generated in the digital signal Sgd3 corresponding to a rising edge Ed12 of the reference signal Sgd2, a rising edge Ed5 will sometimes end up being generated due to chattering near a trailing edge of a half of a cycle before that rising edge Ed6. In this case, when the phase difference between the rising edge Ed12 and the rising edge Ed6 should be detected, the phase difference between the rising edge Ed12 and the rising edge Ed5 is liable to be erroneously detected and an error of half of a cycle is liable to occur.

In order to solve such a problem, the technique using a hysteresis comparator is known (for example, Patent Document 1). In this technique, as shown in FIG. 7C, once the signal level of the analog signal Sga1 falls below the reference level V0 (crosses zero at the zero cross point P'1), when the signal level of the analog signal Sga1 exceeds a hysteresis level Vh, the next zero down cross will be detected by assuming that the analog signal Sga1 has crossed zero upward so as to thereby to remove the effect of chattering.

Note that, although not concerning the technique of removing the effect of noise exerted upon the zero cross, in a system judging a combustion state of an internal combustion engine by detection of current flowing between electrodes of a spark plug, the technique of judging the effect of smoke upon the current flowing between electrodes of the spark plug based on the time during which the current flowing between electrodes of the spark plug exceeds a predetermined level or the like is known (Patent Documents 2 and 3).

Patent Document 1: Japanese Patent Publication (A) No. 2004-12168
Patent Document 2: Japanese Patent Publication (A) No. 2004-239085
Patent Document 3: Japanese Patent Publication (A) No. 11-50941

DISCLOSURE OF THE INVENTION

Technical Problem

However, even if setting the hysteresis level as in Patent Document 1, if the amplitude of the noise produced due to chattering etc. exceeds the hysteresis level, ultimately the noise will end up appearing in the output digital signal as well. In particular, as explained above, in the case of identifying the phase difference, even if noise of a relatively fine time occurs, a relatively large error of half a cycle is liable to end up occurring.

Accordingly, preferably there is provided a digital filter device, a phase detection device, a position detection device, an AD conversion device, a zero cross detection device, and a digital filter program capable of removing the effect of noise upon the edge of a digital signal.

Technical Solution

A digital filter device of a first aspect of the present invention is A digital filter device for filtering a binary input digital signal and outputting a binary output digital signal, including a toggle flip-flop which switches a signal level of the output digital signal each time a predetermined trigger signal is input; a level judgment portion configured to output a predetermined first enable signal in either of a period during which a signal level of the input digital signal and the signal level of the output digital signal match and a period during which they do not match; and a first counter configured to count predetermined clock signals while the first enable signal is being input so as to calculate a first count, and reset the first count to a predetermined first initial value and output the trigger signal to the toggle flip-flop when the first count has reached a predetermined first reference value.

Preferably, the digital filter device further including a status judgment portion configured to become a prohibit state that output of a predetermined second enable signal is prohibited when a predetermined clear signal has been input, the prohibit state is released conditional on at least the first enable signal being once input, and output the second enable signal while the first enable signal is not being input in the state where the prohibit state is released; and a second counter configured to count the clock signals while the second enable signal is being input so as to calculate a second count, and reset the second count to a predetermined second initial value and output the clear signal when the second count has reached a predetermined second reference value, wherein the first counter is configured to reset the first count to the first initial value when the clear signal is being input.

A digital filter device of a second aspect of the present invention is A digital filter device for filtering a binary input digital signal and outputting a binary output digital signal, including a first accumulating portion configured to cumulatively add either of a time during which a signal level of the input digital signal is a first level and a time during which it is a second level so as to calculate a first accumulation time, and reset the first accumulation time to a predetermined first initial value and switch the time for cumulative addition between the time of the first level and the time of the second level when the first accumulation time has reached a predetermined first reference value; and a switch portion configured to switch a signal level of the output digital signal when the first accumulation time has reached the first reference value.

Preferably, the digital filter device further including a second accumulation portion configured to cumulatively add the time of the second level in a case where the time cumulatively added in the first accumulation portion is the time of the first level and cumulatively add the time of the first level in a case where the time cumulatively added in the first accumulation portion is the time of the second level so as to calculate a second accumulation time, reset the second accumulation time to a predetermined second initial value and prohibit the calculation of the second accumulation time when the second accumulation time has reached a predetermined second reference value, and release the prohibition on the calculation of the second accumulation time conditional on at least the first accumulation time being once calculated at the first accumulation portion, wherein the first accumulation portion is configured to reset the first accumulation time to the first initial value when the second accumulation time has reached a predetermined second reference value.

A phase detection device of a third aspect of the present invention is a phase detection device including a digital filter device filtering a binary input digital signal and outputting a binary output digital signal; and a phase detection portion detecting a phase of the input digital signal based on the output digital signal output from the digital filter device, wherein the digital filter device includes a first accumulating portion configured to cumulatively add either of a time during which a signal level of the input digital signal is a first level and a time during which it is a second level so as to calculate a first accumulation time, and reset the first accumulation time to a predetermined first initial value and switch the time for cumulative addition between the time of the first level and the time of the second level when the first accumulation time has reached a predetermined first reference value, and a switch portion configured to switch a signal level of the output digital signal when the first accumulation time has reached the first reference value.

A position detection device of a fourth aspect of the present invention is a position detection device including a resolver shifting a phase of an input analog type waveform shaped excitation signal by exactly an amount in accordance with a rotation position of a resolver shaft and outputting the result; a comparator converting the signal output from the resolver to a binary input digital signal; a digital filter device filtering the input digital signal output from the comparator and outputting a binary output digital signal; and a position detection portion calculating a rotation position of the resolver based on a phase difference between a binary digital type reference signal having the same period and phase as those of the excitation signal and the output digital signal output from the digital filter device, wherein the digital filter device includes a first accumulating portion configured to cumulatively add either of a time during which a signal level of the input digital signal is a first level and a time during which it is a second level so as to calculate a first accumulation time, and reset the first accumulation time to a predetermined first initial value and switch the time for cumulative addition between the time of the first level and the time of the second level when the first accumulation time has reached a predetermined first reference value, and a switch portion configured to switch a signal level of the output digital signal when the first accumulation time has reached the first reference value.

An AD conversion device of a fifth aspect of the present invention is an AD conversion device for converting an analog signal to a binary digital signal, including an accumulating portion configured to cumulatively add either of a time during which a signal level of the analog digital signal is higher than a predetermined reference level and a time when it is lower so as to calculate the accumulation time, and reset the accumulation time to a predetermined initial value and switch the time for cumulative addition between the time of the high level and the time of the low level when the accumulation time has reached a predetermined reference value; and a switch portion configured to switch a signal level of the digital signal when the accumulation time has reached the reference value.

A zero cross detection device of a sixth aspect of the present invention is a zero cross detection device configured to cumulatively add a time during which a signal level of an input analog signal is higher than a predetermined reference level or a time during which it is lower, and output a zero cross detection signal when the accumulated time has reached a predetermined reference value.

A digital filter program of a seventh aspect of the present invention is a digital filter program for making a computer function as a digital filter device filtering a binary input digital signal and outputting a binary output digital signal, configured to make the computer function as an accumulating portion cumulatively adding either of a time during which a signal level of the input digital signal is a first level and a time during which it is a second level so as to calculate an accumulation time, and resetting the accumulation time to the initial value and switching the time for cumulative addition between the time of the first level and the time of the second level when the first accumulation time has reached a predetermined first reference value; and a switch portion switching a signal level of the output digital signal when the first accumulation time has reached the first reference value.

Effect of the Invention

According to the present invention, the effect of noise can be removed from the edge of a digital signal.

EXPLANATION OF NOTATIONS

4 . . . digital filter device, 12 . . . toggle flip-flop (first accumulation portion, switch portion), 13 . . . XOR circuit (first accumulation portion), 14 . . . charge counter (first accumulation portion), Sdi, DIN . . . input digital signals, and Sdo, DOUT . . . output digital signals.

BEST MODE FOR CARRYING OUT THE INVENTION

Figure 1:
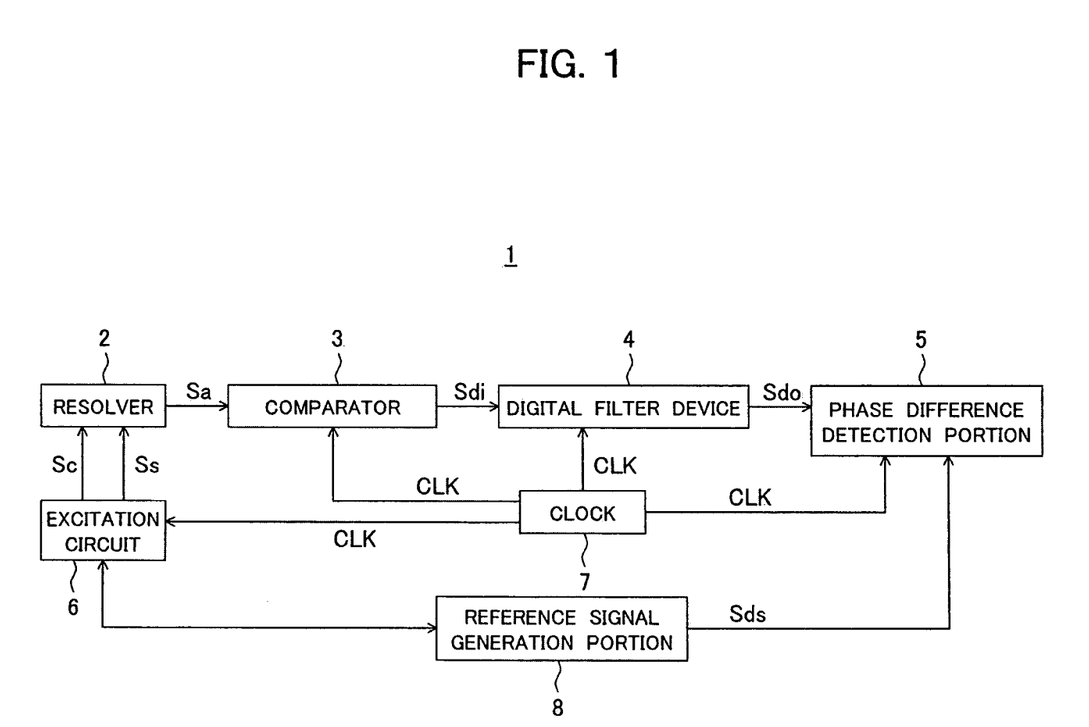
FIG. 1 is a block diagram schematically showing the overall configuration of a rotation position detection device according to an embodiment of the present invention.

FIG. 1 is a block diagram schematically showing the overall configuration of a rotation position detection device 1 according to an embodiment of the present invention. The rotation position detection device 1 is provided with a resolver 2 attached to a motor or other detected object, a comparator 3 which performs predetermined processing with respect to an analog signal Sa from the resolver 2, a digital filter device 4, and a phase difference detection portion 5 and is configured as the device which identifies a rotation position of the detected object. The operation thereof is as follows.

The resolver 2 receives as input the two phases of analog type excitation signals Ss and Sc produced by an excitation circuit 6 based on a clock signal CLK from a clock generator. The signal levels of the excitation signals Ss and Sc respectively fluctuate by $\sin(\omega t)$ and $\cos(\omega t)$. The resolver 2 outputs the analog signal Sa obtained by shifting the input excitation signal Ss by exactly a rotation angle $\theta$ of the resolver shaft. The signal level of the analog signal Sa fluctuates by $\sin(\omega t + \theta)$.

The comparator 3, as explained with reference to FIG. 7, while synchronized with the clock signal CLK from the clock generator, outputs a signal which becomes constant at a predetermined low level (or high level) of the signal level when the signal level of the analog signal Sa is high relative to the predetermined reference level and outputs a signal which becomes constant at a predetermined high level (or low level) of the signal level when the signal level of the analog signal Sa is low relative to the predetermined reference level. Namely, it AD converts the analog signal Sa to a binary digital signal Sdi for output with reference to the reference level.

The digital filter device 4 outputs a binary digital signal Sdo obtained by filtering the digital signal Sdi from the comparator 3. Namely, the digital filter device 4 removes noise due to chattering from the digital signal Sdi and outputs the result.

The phase difference detection portion 5 receives as input the digital signal Sdo output from the digital filter device 4 and a reference signal Sds output from a reference signal generation portion 8. The reference signal Sds is a digital signal having the same period and phase as those of the excitation signal Ss output from the excitation circuit 6. Further, the phase difference detection portion 5 detects the phase difference between the reference signal Sds and the digital signal Sdo. This detection of the phase difference is equivalent to the detection of the phase difference between the excitation signal Ss and the analog signal Sa. The rotation angle $\theta$ (rotation position) of the resolver shaft is identified by this.

Figure 2:
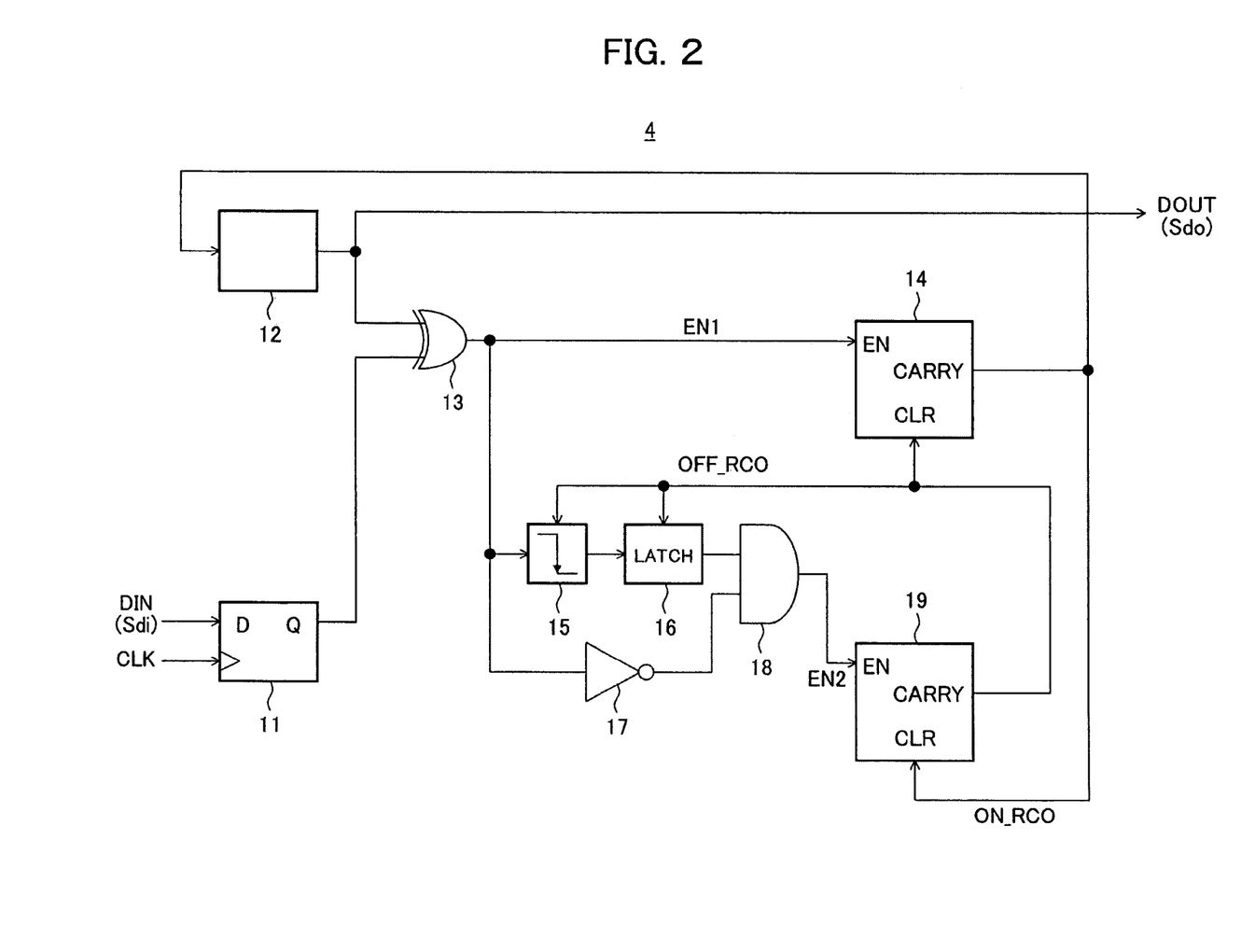
FIG. 2 is a block diagram showing the configuration of a digital filter device of the rotation position detection device of FIG. 1.

FIG. 2 is a block diagram showing the configuration of the digital filter device 4. The digital filter device 4 is configured as a device which filters an input signal DIN and outputs an output signal DOUT. Note that, as shown in FIG. 1, in a case where the digital filter device 4 is assembled in the rotation position detection device 1, the input signal DIN equals the digital signal Sdi, and the output signal DOUT equals the digital signal Sdo. All flip-flops and counters explained later receive as input clock signals CLK from the clock generator, that is, the same clock signals. However, the illustration is omitted in FIG. 2. In the following explanation, an explanation will be sometimes given assuming the signal level of the digital signal to be the value of 1 bit of information, that is, 0 (false, low level) or 1 (true, high level). Further, an explanation will be sometimes given assuming a change of the value from 0 to 1 as the rising edge of the signal level and a change from 1 to 0 as the trailing edge of the signal level.

A delay flip-flop (DFF) 11 receives as input the input signal DIN and the clock signal CLK, holds the value of the input signal DIN at a point of time of the rising edge (or trailing edge) of the clock signal CLK, and outputs that value from an output terminal Q in synchronization with the next clock signal CLK. A toggle flip-flop (toggle FF) 12 outputs the output signal DOUT and alternately switches the value of the output signal DOUT between 1 and 0 each time a carry on signal ON_RCO output from a charge counter 14 as the trigger signal is input. An exclusive OR logic circuit (XOR circuit: eXclusive OR circuit) 13 receives as input the output signal from the DFF 11 and the output signal from the toggle FF 12 and outputs a signal having a value of 1 as a first enable signal EN1 when the values of the two signals do not match.

The charge counter 14 performs counting in synchronization with the clock signal CLK while the first enable signal EN1 is being input. The counting is carried out within a range of n bits of information. Namely, the counting is carried out $2^n$ times from the initial value (for example 0) until the count becomes the upper limit value (for example $2^n$) and is cleared (reset to the initial value) when the count has reached the upper limit value. Further, the count is cleared at a time when a carry off signal OFF_RCO output from a stay counter 19 as a clear signal is input to the charge counter 14. Note that, since the counting is carried out in synchronization with the clock signal CLK, the charge counter 14 cumulatively adds the time (cycles of clock signal) while the first enable signal EN1 is being input. When the count has reached the upper limit value, the charge counter 14 outputs the carry signal ON_RCO having the value of 1 for exactly a time of 1 clock.

An edge detection flip-flop (edge detection FF) 15 receives as input the signal from the XOR circuit 13 and outputs a signal having the value of 1 when detecting a trailing edge of the signal from the XOR circuit 13. A latch flip-flop (latch FF)

16 receives as input the signal from the edge detection FF15 and the clock signal CLK, holds the signal from the edge detection FF15 when the clock signal CLK is 1, and outputs the same. An inverter circuit (NOT: NOT circuit) 17 inverts the signal from the XOR circuit 13 for output. An AND circuit 18 outputs an AND logic of the signal from the latch FF 16 and the signal from the inverter circuit 17.

The stay counter 19 performs the counting in synchronization with the clock signal CLK while a signal having the value of 1 is being input from the AND circuit 18 as a second enable signal EN2. The counting is carried out within a range of m bits of information. Namely, the counting is carried out $2^m$ times from the initial value (for example 0) until the count becomes the upper limit value (for example $2^m$) and is cleared (reset to the initial value) when the count has reached the upper limit value. Further, the count is cleared at a time when a carry on signal ON_RCO output from the charge counter 14 as the clear signal is input to the stay counter 19. Note that, since the counting is carried out in synchronization with the clock signal CLK, the stay counter 19 cumulatively adds the time (cycles of the clock signal) while the second enable signal EN2 is being input. The stay counter 19 outputs the carry OFF signal OFF_RCO having the value of 1 for exactly the time of one clock when the count has reached the upper limit value.

The operation of the digital filter device 4 having the above configuration will be explained next.

Figure 3:
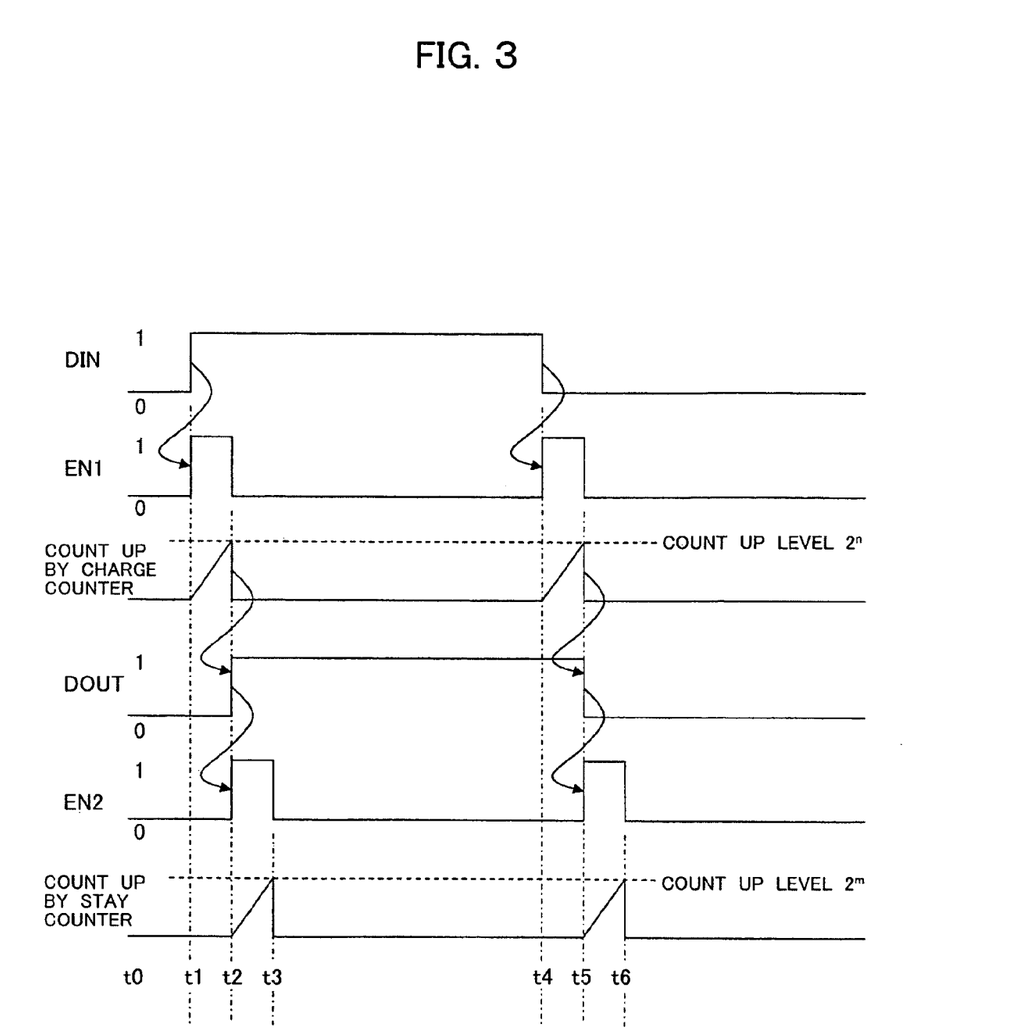
FIG. 3 is a timing chart explaining an operation of the digital filter device of FIG. 2 in a case where there is no noise.

First, a case where there is no chattering noise or other noise will be explained. FIG. 3 is a timing chart showing values of output signals of the different portions when there is no noise.

The initial value of the signal output by the toggle FF 12 and the initial value of the signal DIN input to the DFF 11 (the signal output from the DFF 11) are given the same value (time t0). For example, these are made 0. Namely, an input signal DIN having the value of 0 is input to the digital filter device 4, and the digital filter device 4 outputs an output signal DOUT of the value 0.

When the input signal DIN changes from 0 to 1 (time t1), the output of the XOR circuit 13 changes from 0 to 1. Namely, the first enable signal EN1 is output from the XOR circuit 13. While the first enable signal EN1 is being input, the charge counter 14 repeats the counting in synchronization with the clock signal CLK and outputs the carry on signal ON_RCO for exactly the time of one clock at a time when the count has reached the upper limit value (time t2). When the carry on signal ON_RCO is input as the trigger signal to the toggle FF 12, the toggle FF 12 changes the output from 0 to 1. As a result, the value of the signal DOUT becomes 1. Further, when the carry on signal ON_RCO is input as a clear signal to a clear terminal CLR of the stay counter 19, the stay counter 19 resets the count to the initial value.

When the output of the toggle FF 12 changes from 0 to 1, the output of the XOR circuit 13 changes from 1 to 0. Due to this, the outputs of the edge detection FF 15 and latch FF 16 and the inverter circuit 17 become 1, and the output of the AND circuit 18 becomes 1. Namely, the second enable signal EN2 is output. The stay counter 19 repeats the counting in synchronization with the clock signal CLK while the second enable signal EN2 is being input and outputs the carry off signal OFF_RCO for exactly the time of one clock at a time when the count has reached the upper limit value (time t3). By this signal, the edge detection FF 15, latch FF 16, and charge counter 14 are reset to the initial state.

After that, until the input signal DIN changes from 1 to 0, the flip-flops 11, 12, 15, and 16 and counters 14 and 19 do not operate. When the input signal DIN changes from 1 to 0 (time t4), these portions operate in the same way as the time when it changed from 0 to 1.

As described above, when there is no chattering noise or other noise, the digital filter device 4 outputs the output signal DOUT having the same value as that of the input signal DIN with a delay from the input of the input signal DIN of exactly a time T1 during which the charge counter 14 performs a full count (time from t1 to t2, cycle of clock×$2^n$). Note that, the phase difference detection portion 5 performs correction by subtracting a phase corresponding to the time T1 from the phase difference between the output signal DOUT and the reference signal Sds and identifies the rotation position.

Figure 4:
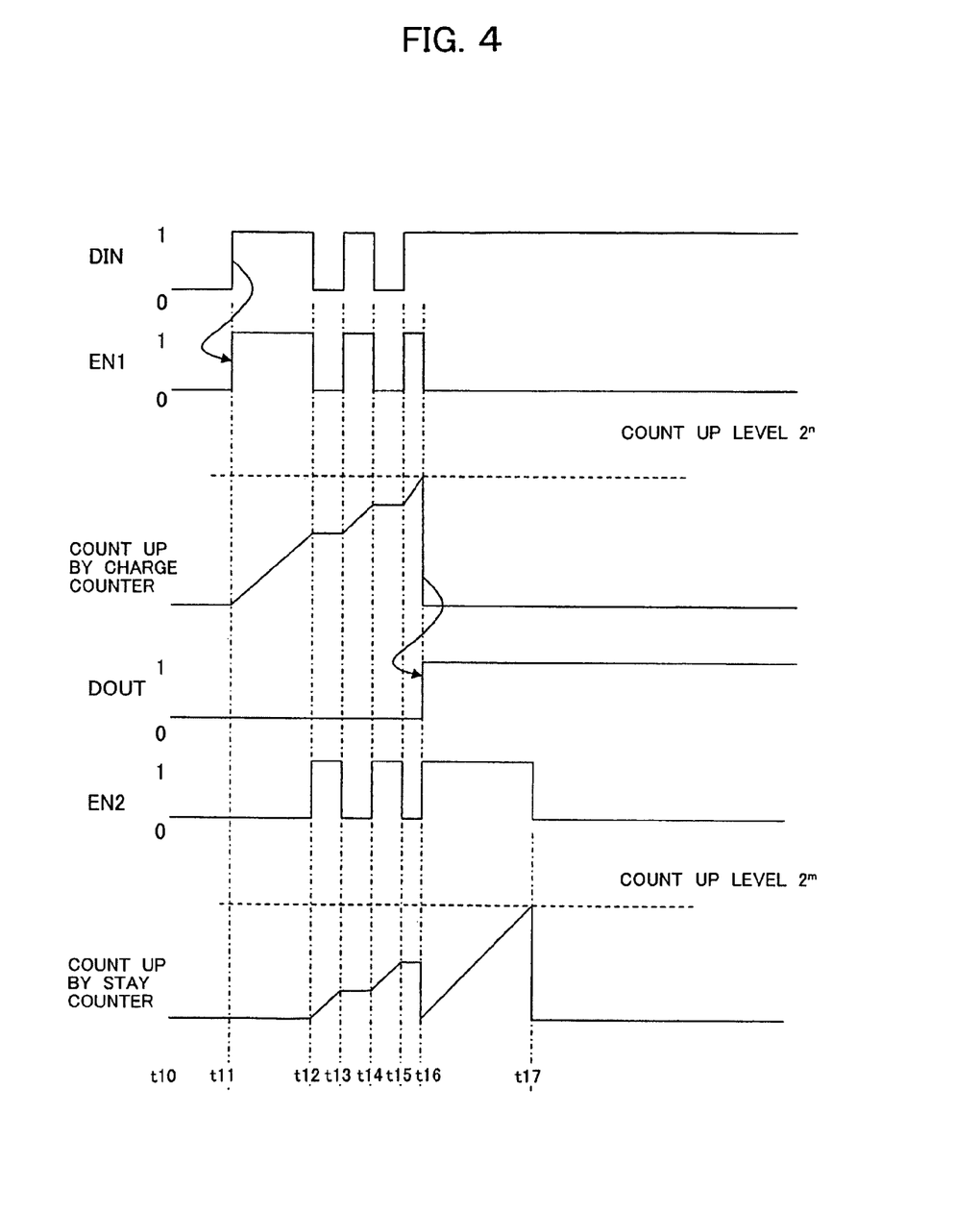
FIG. 4 is a timing chart explaining the operation of the digital filter device of FIG. 2 in a case where there is a relatively small noise.

Next, a case where chattering or other noise is generated will be explained. FIG. 4 is a timing chart showing values of output signals of the different portions in a case where relatively minute noise represented by chattering is generated.

The times t10 to t11 are the same as the times t0 to t1 of FIG. 3. The charge counter 14 starts counting from the time t11. When the output signal of the input signal DIN changes from 1 to 0 before the count of the charge counter 14 has reached the upper limit value (time t12), the output of the XOR circuit 13 changes from 1 to 0. Accordingly, an edge is detected by the edge detection FF 15, the output of the latch FF is fixed to 1, the output of the inverter circuit 17 becomes 1, the second enable signal EN2 is output from the AND circuit 18, and the stay counter 19 starts counting. Further, the charge counter 14 suspends counting and holds the value counted hitherto.

After that, when the input signal DIN changes from 0 to 1 again (time t13), the output of the AND circuit 18 becomes 0. Accordingly, the stay counter 19 suspends counting and holds the value counted hitherto. On the other hand, the charge counter 14 restarts counting. Further, when the input signal DIN changes from 1 to 0 again (time t14), the charge counter 14 suspends counting, and the stay counter 19 restarts counting. Namely, the charge counter 14 performs counting in the state where the input signal DIN is 1 (state where the value of the input signal DIN and the value of the output signal DOUT are different), while the stay counter 19 performs counting in a state where the input signal DIN is 0 (state where the value of the input signal DIN and the value of the output signal DOUT are the same).

When the charge counter 14 reaches the upper limit value earlier than the stay counter 19, in the same way as the time t2 of FIG. 3, the carry on signal ON_RCO is output from the charge counter 14, and the toggle FF 12 changes the output signal DOUT from 0 to 1 (time t16). Namely, the digital filter device 4 outputs an output signal DOUT having the same value as that of the input signal DIN with a delay from the input of the input signal DIN of exactly a time T2 required for the charge counter 14 to perform a full count (time from t11 to t16, larger than clock period×$2^n$, but smaller than clock period×$2^{n+m}$). Note that, a case where the stay counter 19 has reached the upper limit value earlier than the charge counter 14 will be explained later.

The stay counter 19 receives as input the carry on signal ON_RCO output from the charge counter 14 and, after the count is reset to the initial value (after the time t16), performs counting in the same way as that after the time t2 of FIG. 3. Further, it outputs the carry off signal OFF_RCO for exactly the time of one clock at the time when the count has reached the upper limit value (time t17). By the resetting of the edge detection FF 15 and the latch FF 16 to the initial state by this signal, the stay counter 19 does not perform counting even in the state where the value of the input signal DIN and the value of the output signal DOUT are the same. The count of the stay counter 19 is maintained at the initial value until the counting is started next at the charge counter 14.

Figure 5A:
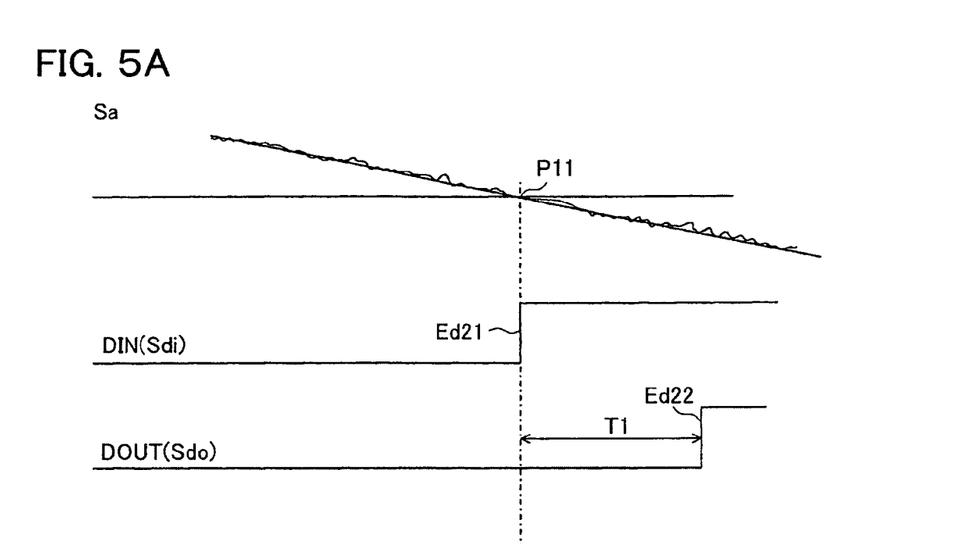
FIGS. 5A and 5B are diagrams explaining an effect of the digital filter device of FIG. 2.
Figure 5B:
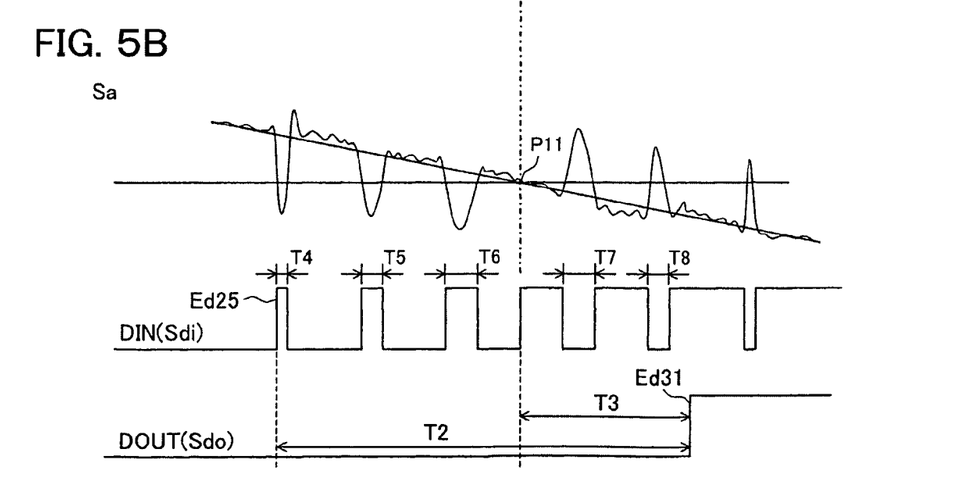

FIG. 5 is a diagram explaining the advantageous effect of the digital filter device 4, in which FIG. 5A shows a timing chart when chattering does not occur, and FIG. 5B shows a timing chart when chattering occurs.

As shown in FIG. 5A, when there is no chattering, the digital signal DIN obtained by comparating the analog signal Sa has a rising edge Ed21 at schematically the same point of time as the zero cross point P11 in the case when viewing the analog signal Sa macroscopically (in the diagram, indicated by an approximation line). Further, the digital signal DOUT output from the digital filter device 4 has a rising edge Ed22 corresponding to the rising edge Ed21 with a delay of the time T1 (clock period×$2^n$) from the rising edge Ed21 of the digital signal DIN.

On the other hand, as shown in FIG. 5B, when there is chattering, the digital signal DIN obtained by comparating the analog signal Sa has a plurality of rising edges at the same points of time as the plurality of zero cross points in the case when viewing the analog signal Sa microscopically. However, the digital signal DOUT output from the digital filter device 4 has only a rising edge Ed31 corresponding to the macroscopic zero cross point P11 with a delay of exactly the time T2 (larger than clock period×$2^n$, smaller than clock period×$2^{n+m}$) from the first rising edge Ed25 among a plurality of rising edges of the digital signal DIN.

Accordingly, even when a plurality of edges are produced due to chattering in the digital signal DIN after comparison, only one edge corresponding to the zero cross point P11 seen macroscopically is generated.

Further, a plurality of edges of the digital signal DOUT are generated at both points of time before the zero cross point P11 and points of time after it. Therefore, if n (parameter for counting time) is adequately set in accordance with the characteristic etc. of chattering of each device so that the time during which the charge counter 14 performs counting at the points of time before the zero cross point P11 (T4+T5+T6) and the time during which the charge counter 14 does not perform counting at the points of time after the zero cross point P11 (T7+T8) become the same degree, it is possible to make a time T3 from the zero cross point P11 up to the rising edge Ed31 and a time T1 from the zero cross point P11 up to the rising edge Ed22 in the case where there is no chattering the same degree.

Figure 6:
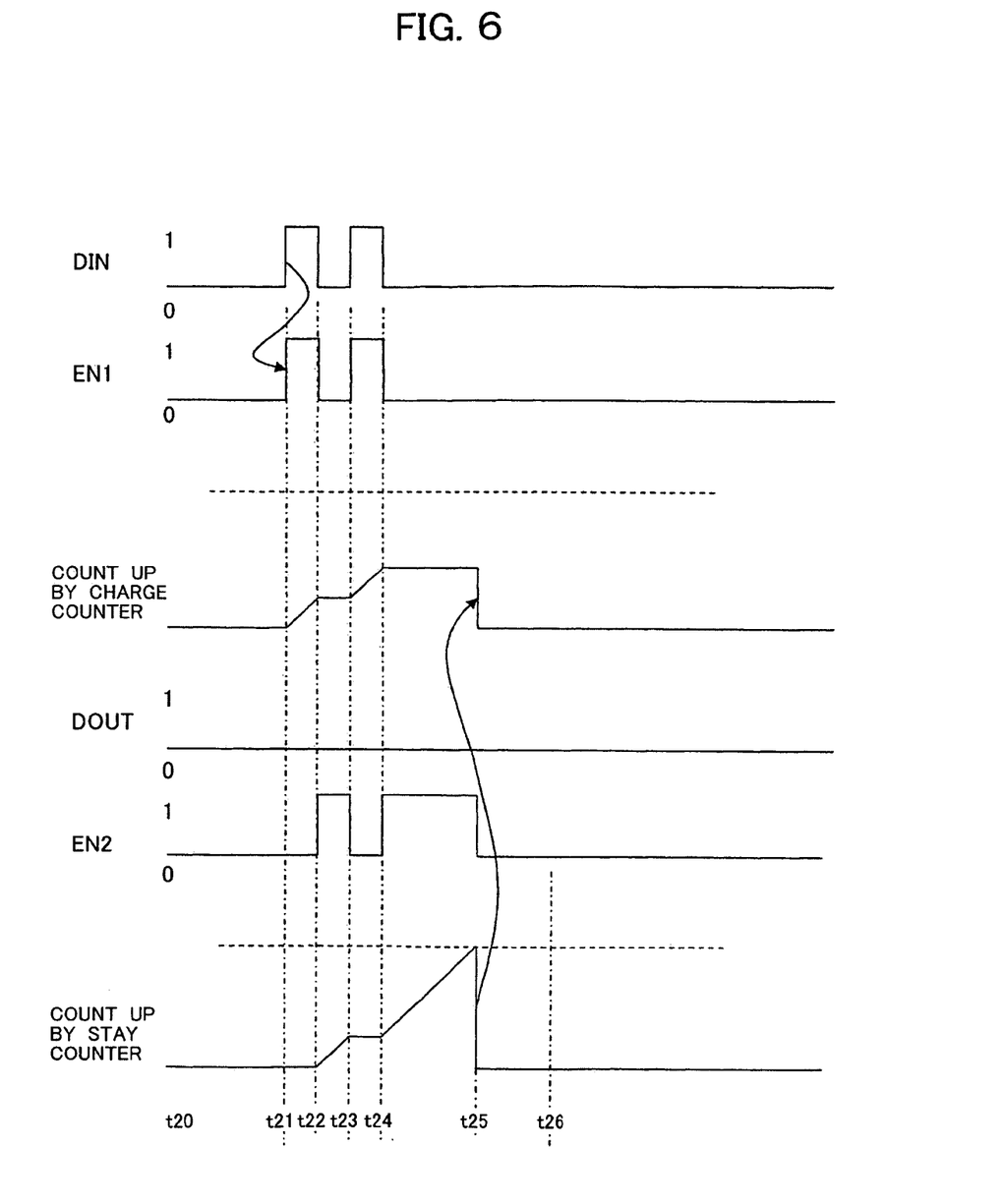
FIG. 6 is a timing chart explaining the operation of the digital filter device of FIG. 2 in a case where there is a relatively large noise.

FIG. 6 is a timing chart showing values of output signals of portions when the stay counter 19 has reached the upper limit value earlier in the case where the charge counter 14 and the stay counter 19 alternately perform counting.

The time t20 to time t24 are the same as time t10 to time t15 of FIG. 4. At the time t25, when the stay counter 19 has reached the upper limit value earlier than the charge counter 14, the carry off signal OFF_RCO is output from the stay counter 19, and the charge counter 14, edge detection FF 15, and latch FF 16 are reset to the initial state. Further, the toggle FF 12 does not change the output. Namely, the digital filter device 4 judges that the change of the input signal DIN is not due to a zero cross or noise related to a zero cross such as chattering noise and enters a standby state for generating a new edge. Due to this, the effect of any relatively large noise generated irrelevant to a zero cross is removed.

Note that, in the embodiment described above, the charge counter 14 is an example of the first counter of the present invention, the XOR circuit 13 is an example of the level judgment portion of the present invention, the stay counter 19 is an example of the second counter of the present invention, the combination of the edge detection FF 15, latch FF 16, inverter circuit 17, and AND circuit 18 is an example of the status judgment portion of the present invention, the combination of the toggle FF 12, XOR circuit 13, and charge counter 14 is an example of the first accumulation portion of the present invention, the toggle FF 12 is an example of the switch portion of the present invention, the combination of the edge detection FF 15, latch FF 16, inverter circuit 17, AND circuit 18, and stay counter 19 is an example of the second accumulation portion of the present invention, the phase difference detection portion 5 is an example of the phase detection portion and position detection portion of the present invention, the rotation position detection device 1 is an example of the phase detection device of the present invention, the combination of the comparator 3 and digital filter device 4 is an example of the AD conversion device of the present invention, and the charge counter 14 is an example of the zero cross detection device of the present invention.

The portions shown in FIG. 1 and FIG. 2 may be configured by logic circuits or constructed in a computer including a CPU, RAM, ROM, external memory device etc. by the CPU running a program stored in the ROM etc. When the digital filter device 4 is constructed by the CPU running a program, the program is an example of the digital filter program of the present invention.

The present invention is not limited to the above embodiments and may be carried out in various ways.

The input signal filtered by the digital filter device is not limited to one obtained by conversion of an analog signal to a digital signal and may be one generated (detected) as a digital signal from the start as well.

Figure 8:
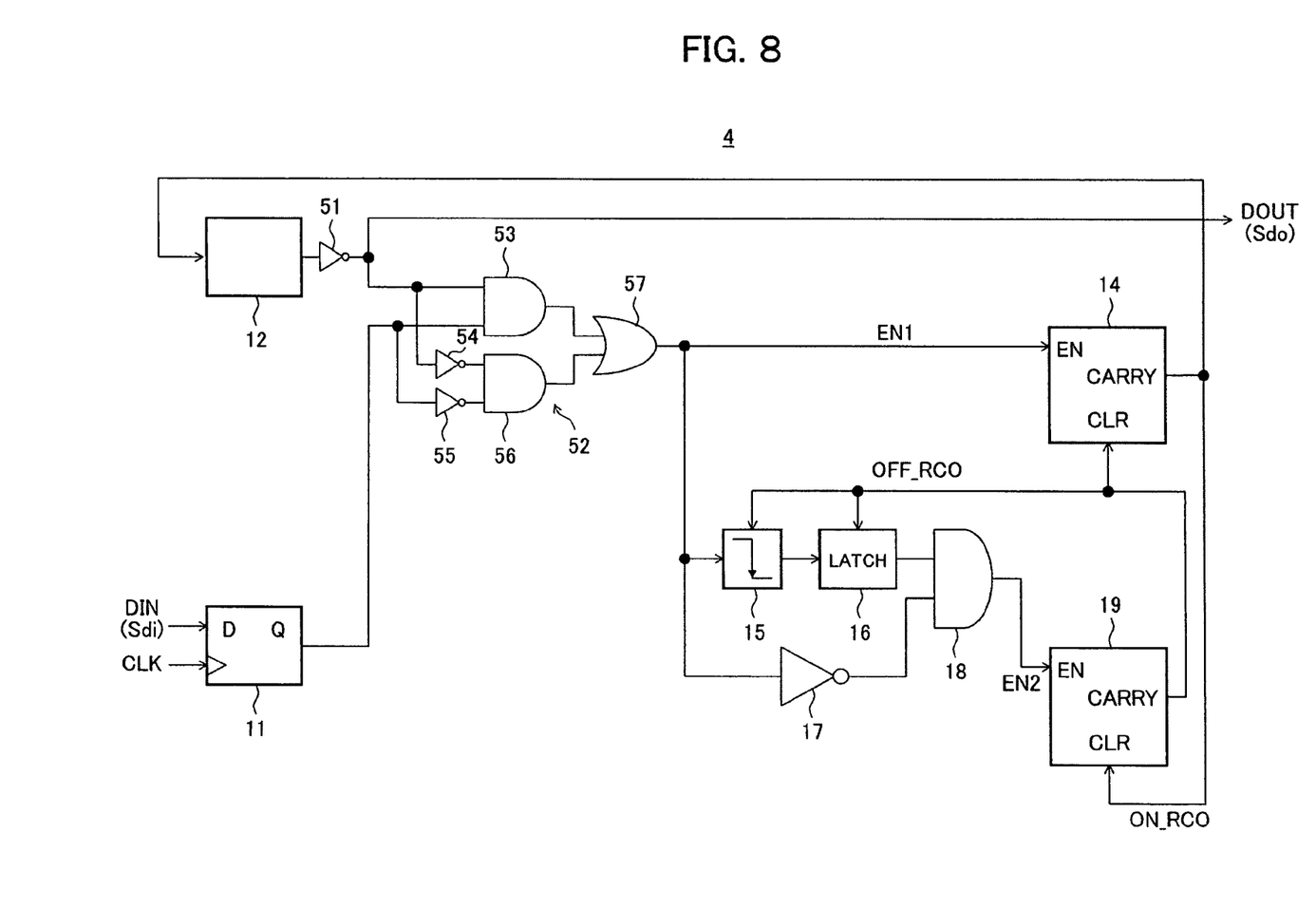
FIG. 8 is a block diagram explaining a modification of the present invention.

The input signal and the output signal of the digital filter device may differ in signal level as well. FIG. 8 shows a modification of the digital filter device which inverts the value of the input binary digital signal DIN for output. In this modification, an inverter circuit 51 is provided immediately after the toggle FF 12, and a coincidence circuit 52 (an example of the level judgment portion) which outputs the first enable signal EN1 when values of the two input digital signals match is provided in place of the XOR circuit 13. The coincidence circuit 52 is provided with, for example, an AND circuit 53 receiving as input the output signals of the inverter circuit 51 and DFF 11, inverter circuits 54 and 55 which invert output signals of the inverter circuit 51 and DFF 11, an AND circuit 56 receiving as input the output signals of the inverter circuits 54 and 55, and an OR circuit 57 receiving as input the output signals of the AND circuit 53 and AND circuit 56.

The phase detection portion and the phase detection device are not limited to the phase difference detection portion 5 and the rotation position detection device 1 which detect a phase difference between the reference signal of the resolver and the output signal and detect the rotation position on a basis of that phase difference. For example, these may be a phase detection portion and a phase detection device designed for the detection of the phase itself of a measured object which rotates or rocks.

The zero cross detection device may be one detecting the zero cross point (edge) of a signal representing a waveform. Accordingly, the input signal for which the zero cross is detected may be an analog signal or a digital signal. Further, the detection result of the zero cross point can be utilized for various objects. For example, it can be utilized for a device which does not have to output the digital signal after removing the noise (the output signal DOUT of the embodiment), for example, a wave measurement device which calculates a number of waves and frequencies of waves on a basis of the zero cross points of the analog signal obtained by measuring a wave height. Even in the case where the digital signal from which noise was removed is output, the output signal is not limited to a binary digital signal. Predetermined correction processing based on the detection of the zero cross point may be carried out with respect to the input signal to output an analog signal or output a digital signal having a signal level fluctuating at a plurality of levels.

The invention claimed is:

1. A digital filter device for filtering a binary input digital signal and outputting a binary output digital signal, comprising:
   a toggle flip-flop which switches a signal level of the output digital signal each time a predetermined trigger signal is input;
   a level judgment portion configured to output a predetermined first enable signal in either of a period during which a signal level of the input digital signal and the signal level of the output digital signal match and a period during which they do not match;
   a first counter configured to
      count predetermined clock signals while the first enable signal is being input so as to calculate a first count,
      suspend counting and hold a value counted hitherto when the input of the first enable signal is stopped,
      restart counting from the value held when the input of the first enable signal is restated, and
      reset the first count to a predetermined first initial value and output the trigger signal to the toggle flip-flop when the first count has reached a predetermined first reference value.

2. A digital filter device for filtering a binary input digital signal and outputting a binary output digital signal, comprising:
   a toggle flip-flop which switches a signal level of the output digital signal each time a predetermined trigger signal is input;
   a level judgment portion configured to output a predetermined first enable signal in either of a period during which a signal level of the input digital signal and the signal level of the output digital signal match and a period during which they do not match;
   a first counter configured to
      count predetermined clock signals while the first enable signal is being input so as to calculate a first count, and
      reset the first count to a predetermined first initial value and output the trigger signal to the toggle flip-flop when the first count has reached a predetermined first reference value;
   a status judgment portion configured to
      become a prohibit state that output of a predetermined second enable signal is prohibited when a predetermined clear signal has been input, the prohibit state is released conditional on at least the first enable signal being once input, and
      output the second enable signal while the first enable signal is not being input in the state where the prohibit state is released; and
   a second counter configured to
      count the clock signals while the second enable signal is being input so as to calculate a second count, and
      reset the second count to a predetermined second initial value and output the clear signal when the second count has reached a predetermined second reference value, wherein
   the first counter is configured to reset the first count to the first initial value when the clear signal is being input.

3. A digital filter device for filtering a binary input digital signal and outputting a binary output digital signal, comprising:
   a first accumulating portion configured to
      cumulatively add a time while a signal level of the input digital signal is one level of a first level and a second level so as to calculate a first accumulation time,
      suspend cumulatively adding and hold a time cumulatively added hitherto when the signal level of the input digital signal becomes the other level of the first level and the second level,
      restart cumulatively adding from the time held when the signal level of the input digital signal becomes the one of the first level and the second signal level again, and
      reset the first accumulation time to a predetermined first initial value and switch the time for cumulative addition between the time of the first level and the time of the second level when the first accumulation time has reached a predetermined first reference value; and
   a switch portion configured to switch a signal level of the output digital signal when the first accumulation time has reached the first reference value.

4. A digital filter device as set forth in clam 3, further comprising:
   a second accumulation portion configured to
      cumulatively add the time of the second level in a case where the time cumulatively added in the first accumulation portion is the time of the first level and cumulatively add the time of the first level in a case where the time cumulatively added in the first accumulation portion is the time of the second level so as to calculate a second accumulation time,
      reset the second accumulation time to a predetermined second initial value and prohibit the calculation of the second accumulation time when the second accumulation time has reached a predetermined second reference value, and
      release the prohibiting of the calculation of the second accumulation time when the first accumulation time has been once calculated at the first accumulation portion, wherein
   the first accumulation portion is configured to reset the first accumulation time to the first initial value when the second accumulation time has reached a predetermined second reference value.

5. A phase detection device comprising:
   a digital filter device filtering a binary input digital signal and outputting a binary output digital signal; and
   a phase detection portion detecting a phase of the input digital signal based on the output digital signal output from the digital filter device, wherein
   the digital filter device includes
   a first accumulating portion configured to
      cumulatively add a time while a signal level of the input digital signal is one level of a first level and a second level so as to calculate a first accumulation time,
      suspend cumulatively adding and hold a time cumulatively added hitherto when the signal level of the input digital signal becomes the other level of the first level and the second level,
      restart cumulatively adding from the time held when the signal level of the input digital signal becomes the one of the first level and the second signal level again, and
      reset the first accumulation time to a predetermined first initial value and switch the time for cumulative addition between the time of the first level and the time of the second level when the first accumulation time has reached a predetermined first reference value, and
a switch portion configured to switch a signal level of the output digital signal when the first accumulation time has reached the first reference value.

6. A position detection device comprising:
a resolver shifting a phase of an input analog type waveform shaped excitation signal by exactly an amount in accordance with a rotation position of a resolver shaft and outputting the result;
a comparator converting the signal output from the resolver to a binary input digital signal;
a digital filter device filtering the input digital signal output from the comparator and outputting a binary output digital signal; and
a position detection portion calculating a rotation position of the resolver based on a phase difference between a binary digital type reference signal having the same period and phase as those of the excitation signal and the output digital signal output from the digital filter device, wherein
the digital filter device includes
a first accumulating portion configured to
cumulatively add a time while a signal level of the input digital signal is one level of a first level and a second level so as to calculate a first accumulation time,
suspend cumulatively adding and hold a time cumulatively added hitherto when the signal level of the input digital signal becomes the other level of the first level and the second level,
restart cumulatively adding from the time held when the signal level of the input digital signal becomes the one of the first level and the second signal level again, and
reset the first accumulation time to a predetermined first initial value and switch the time for cumulative addition between the time of the first level and the time of the second level when the first accumulation time has reached a predetermined first reference value, and
a switch portion configured to switch a signal level of the output digital signal when the first accumulation time has reached the first reference value.

7. A non-transitory computer memory storing a digital filter program for making a computer function as a digital filter device filtering a binary input digital signal and outputting a binary output digital signal, configured to make the computer function as
an accumulating portion
cumulatively adding a time while a signal level of the input digital signal is one level of a first level and a second level so as to calculate an accumulation time,
suspending cumulatively adding and hold a time cumulatively added hitherto when the signal level of the input digital signal becomes the other level of the first level and the second level,
restarting cumulatively adding from the time held when the signal level of the input digital signal becomes the one of the first level and the second signal level again, and
resetting the accumulation time to the initial value and switching the time for cumulative addition between the time of the first level and the time of the second level when the first accumulation time has reached a predetermined first reference value; and
a switch portion switching a signal level of the output digital signal when the first accumulation time has reached the first reference value.

* * * * *